United States Patent
Laermer et al.

(10) Patent No.: US 8,040,023 B2
(45) Date of Patent: Oct. 18, 2011

(54) BENDING TRANSDUCER FOR GENERATING ELECTRICAL ENERGY FROM MECHANICAL DEFORMATIONS

(75) Inventors: Franz Laermer, Weil der Stadt (DE); Thorsten Pannek, Stuttgart (DE); Ralf Reichenbach, Esslingen (DE); Marian Keck, Herrenberg (DE)

(73) Assignee: Robert Bosch GmbH, Stuttgart (DE)

( * ) Notice: Subject to any disclaimer, the term of this patent is extended or adjusted under 35 U.S.C. 154(b) by 262 days.

(21) Appl. No.: 12/538,389

(22) Filed: Aug. 10, 2009

(65) Prior Publication Data

US 2010/0033060 A1   Feb. 11, 2010

(30) Foreign Application Priority Data

Aug. 8, 2008   (DE) .................... 10 2008 041 132

(51) Int. Cl.
*H01L 41/113* (2006.01)
*H01L 41/053* (2006.01)
(52) U.S. Cl. ......... 310/339; 310/329; 310/330; 310/365
(58) Field of Classification Search .................. 310/329, 310/330, 339, 365
See application file for complete search history.

(56) References Cited

U.S. PATENT DOCUMENTS

| | | | | |
|---|---|---|---|---|
| 3,987,320 | A * | 10/1976 | Merhar ......................... | 310/339 |
| 4,972,713 | A * | 11/1990 | Iwata .............................. | 73/654 |
| 7,521,841 | B2 * | 4/2009 | Clingman et al. ............. | 310/339 |
| 7,737,608 | B2 * | 6/2010 | Ruggeri et al. ................ | 310/339 |
| 7,839,058 | B1 * | 11/2010 | Churchill et al. ............. | 310/339 |
| 2008/0136292 | A1 * | 6/2008 | Thiesen ......................... | 310/334 |
| 2010/0007246 | A1 * | 1/2010 | Laermer et al. ............... | 310/330 |
| 2010/0072859 | A1 * | 3/2010 | Jager et al. ................ | 310/323.21 |
| 2010/0176694 | A1 * | 7/2010 | Eckstein et al. .............. | 310/339 |
| 2010/0244629 | A1 * | 9/2010 | Nagashima et al. .......... | 310/339 |

FOREIGN PATENT DOCUMENTS

| | | |
|---|---|---|
| DE | 102005062872 | 3/2007 |
| DE | 102007006994 | 2/2008 |
| EP | 0 014 744 | 9/1980 |
| EP | 0 308 403 | 3/1989 |
| FR | 2 584 007 | 1/1987 |
| GB | 1 235 478 | 6/1971 |
| JP | 2-258167 | 10/1990 |
| WO | WO 87/07011 | 11/1987 |
| WO | WO 2008/017533 | 2/2008 |
| WO | WO 2008/017537 | 2/2008 |
| WO | WO 2008/083872 | 7/2008 |

* cited by examiner

*Primary Examiner* — Thomas M Dougherty
(74) *Attorney, Agent, or Firm* — Kenyon & Kenyon LLP

(57) ABSTRACT

A bending transducer device for generating electrical energy from deformations, and a circuit module which has such a bending transducer. The bending transducer includes at least one electrically deformable, vibration-capable, electrically conductive support structure, one piezoelectric element and a first contacting element, the conductive support structure having a first restraining area and a second restraining area for restraining the support structure, the piezoelectric element being designed and situated on the support structure in such a way that the piezoelectric element is deformable due to the deformation of the support structure caused by vibrations, and a first electrode for picking up the voltage generated by the deformation of the piezoelectric element is formed and contacted by the support structure, the first contacting element being connected electrically conductively to the support structure outside the first restraining area and the second restraining area.

15 Claims, 3 Drawing Sheets

BENDING TRANSDUCER FOR GENERATING ELECTRICAL ENERGY FROM MECHANICAL DEFORMATIONS

CROSS REFERENCE

The present application claims the benefit under 35 U.S.C. §119 of German Patent Application No. 102008041132.9 filed on Aug. 8, 2008, the entirety of which is expressly incorporated herein by reference.

BACKGROUND INFORMATION

Piezoelectric transducer mechanisms, such as bending transducers, may be used for generating electrical energy from mechanical deformations. In addition to a piezoelectric element, a bending transducer typically includes a support structure on which the piezoelectric element is fixedly attached. Via the support structure, a mechanical deformation may be introduced into the piezoelectric element, e.g., by vibrating the support structure. The support structure itself may be a second piezoelectric element. To pick off the voltage generated by the deformation of the piezoelectric element, electrodes, which in turn are contactable via contacting elements, may be provided on the piezoelectric element. Piezoelectric transducer mechanisms may be used in sensor and actuator technology in particular.

For example, German Patent Application No. DE 10 2005 062 872 A1 describes a device for detecting the rolling motion of a vehicle wheel in which a piezoelectric element is contacted on a chip carrier via the electrodes formed on its opposite sides, its upper electrode being contacted via a wire bond, and the chip carrier, including the piezoelectric element and the wire bond, are cast into a mold compound. In such sensors for measuring accelerations, e.g., vibrations, reliable contacting is possible with little complexity.

Moreover, piezoelectric materials are increasingly used for generating electrical energy from energies of the surroundings, in particular vibrations and deformations, which is also referred to as energy harvesting. Bending deformations of the piezoelectric element are enabled here which result in clearly higher energy generation than, for example, the mechanical strains of a piezoelectric element cast into a mold compound, as described in German Patent Application No. DE 10 2005 062 872 A1.

In bending transducers in which the support structure and the piezoelectric element are fixedly restrained, electrical contacting of the piezoelectric element may be implemented in a relatively simple manner since the piezoelectric element is fixedly connected to a housing. The use of a sufficiently large-surface and thus expensive piezoelectric element is generally required for such configurations. Furthermore, the areas of the piezoelectric element at the housing connection are particularly exposed to mechanical stresses which reduce the transducer's service life.

If the piezoelectric element is not fixedly restrained, contacting generally takes place via flexible wire connections. However, these wire connections are also exposed to the mechanical stresses that occur and have, with respect to the repeated deformations, only limited reliability.

German Patent Application No. DE 10 2007 006 994 A1 describes a circuit module, in particular for use in a vehicle tire, which has a bending transducer for generating electrical energy from mechanical deformations. The bending transducer contained in the circuit module includes an elastically deformable, vibration-capable support structure and a piezoelectric element. The support structure has a first restraining area and a second restraining area with which the support structure is mounted in a housing of the circuit module. The piezoelectric element is designed and situated on the support structure in such a way that a deformation of the support structure due to vibrations causes the piezoelectric element to be deformable. On its top and bottom sides, the piezoelectric element is coated by an electrically conducting layer which serves as lower and upper electrode, respectively. On the one hand, the support structure may be utilized for electrical contacting by designing it as a metallic spring device, in particular for contacting the lower electrode. On the other hand, the upper electrode formed on the upper side of the piezoelectric element may be contacted via additional contacting means such as a wire, a flexible printed circuit board, or a flexible metal sheet.

SUMMARY

The bending transducer according to the present invention for generating electrical energy from mechanical deformations includes at least one elastically deformable, vibration-capable, electrically conductive support structure which directly forms a first electrode or contacts a first electrode. The support structure is accommodated in two restraining areas, a first contacting element being connected electrically conductively to the support structure outside the restraining areas.

The contacting element has the purpose of establishing an electrical connection from the support structure in particular to a consumer, e.g., an electronic system. Due to the fact that the first contacting element is connected electrically conductively outside the two restraining areas, the influence of such a contacting element on the vibration-capable system, which includes the support structure and the piezoelectric element, may be reduced. This is possible for both a fixed and a loose restraint of the support structure. A loose restraint is to be understood as being a restraint which does not exert a mechanical force on the support structure. This is the case, for example, when the restraining area of the support structure is accommodated in a sufficiently large receptacle.

A particularly advantageous refinement of the present invention provides that the bending transducer has an additional second contacting element which is connected electrically conductively to a second electrode for picking up the voltage generated by deformation of the piezoelectric element, the second contacting element being designed and situated, with respect to the first contacting element, in such a way that, during vibration of the support structure in the contacting area of the first and second electrodes, essentially no relative motion occurs between the first and second contacting elements.

Such a design of the first and second contacting elements for picking up the voltage generated by deformation of the piezoelectric element, which prevents a described relative motion, reduces the mechanical stresses which are exerted by the contacting elements on the support structure and the piezoelectric element during vibration of the support structure. The influence of the contacting elements on the vibration-capable system may thus be kept low.

A bending transducer according to the present invention may be used in particular as a component of a power supply device of an energetically self-sufficient circuit module, the bending transducer being designed as a vibration-capable system for generating a piezoelectric voltage. This makes it possible to omit additional energy sources such as batteries. For example, such a circuit module may be designed as a tire sensor module, e.g., for measuring an internal tire pressure, and/or a temperature, and/or accelerations.

BRIEF DESCRIPTION OF THE DRAWINGS

The present invention is explained in greater detail below based on exemplary embodiments which are represented in the figures.

The same components or components corresponding to one another are labeled with the same reference numerals in the figures.

DETAILED DESCRIPTION OF EXAMPLE EMBODIMENTS

Figure 1:
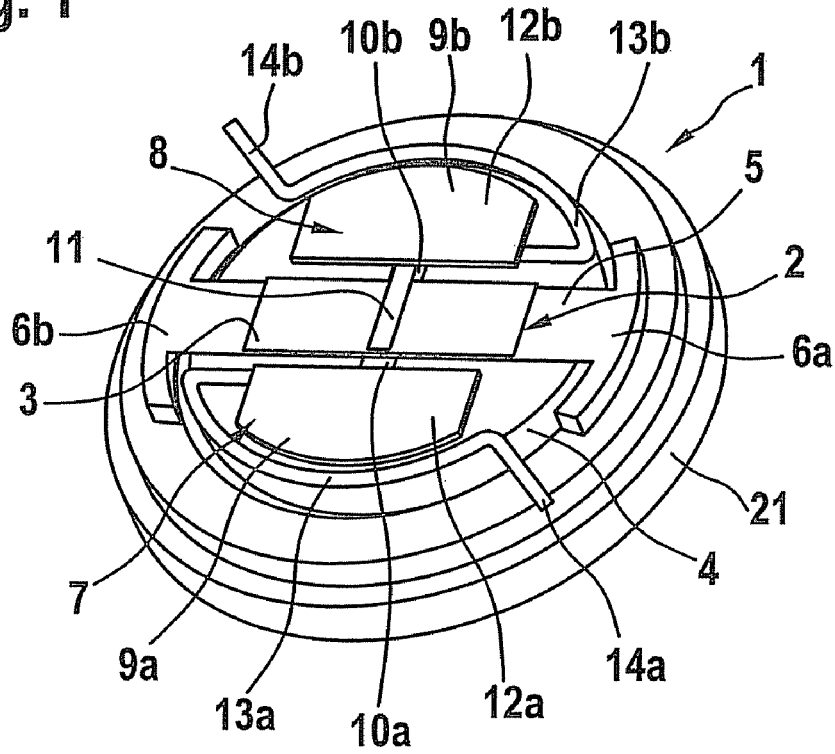
FIG. 1 shows a first specific example embodiment of a bending transducer according to the present invention which is a component of a first circuit module according to the present invention.

FIG. 1 shows a first specific example embodiment of a bending transducer 1 according to the present invention. The bending transducer is a component of first circuit module 20 (see FIG. 2) and is situated on a housing bottom 21 of a housing of circuit module 20.

Circuit module 20 is designed as an energetically self-sufficient sensor module, bending transducer 1 forming a vibration-capable system for generating a piezoelectric voltage and being a component of a power supply device of circuit module 20. In this exemplary embodiment, the circuit module is designed as a tire sensor module for measuring an internal tire pressure. Alternatively, a design as a tire sensor module for measuring a temperature or accelerations is also possible, for example. In addition to bending transducer 1 and housing bottom 21, circuit module 20 has a support ring 22 which supports a printed circuit board 23 having different electronic components. Bending transducer 1 is mounted between support ring 22 and housing bottom 21 and printed circuit board 23 is mounted on support ring 22 opposite housing bottom 21. A housing cover assigned to circuit module 20 is not illustrated in FIG. 2.

Bending transducer 1 generates electrical energy from deformations and includes an elastically deformable, vibration-capable, electrically conductive support structure 2, a piezoelectric element 3, a first contacting element 7, and a second contacting element 8. Support structure 2 has a beam-shaped area 5 having a first end section 6a and a second end section 6b opposite first end section 6a. First end section 6a forms a first restraining area 6a and second end section 6b forms a second restraining area 6b.

Via restraining areas 6a, 6b, which have a sickle shape in this exemplary embodiment, support structure 2 is loosely restrained between housing bottom 21 and support ring 22 assigned to circuit module 20. The loose restraint is obtained in that housing bottom 21 and support ring 22 form a groove whose dimensions are selected to be a little larger than those of restraining areas 6a and 6b so that support structure 2 cannot leave the grooves formed in this way, but also no mechanical force is exerted on support structure 2. Alternatively, a fixed restraint of support structure 2 is also possible.

However, the vibration behavior of bending transducer 1, e.g., the spring constant, may possibly be influenced thereby.

Piezoelectric element 3 is situated on beam-shaped area 5 between first and second end sections 6a, 6b but without covering restraining areas 6a, 6b. A deformation of support structure 2 due to vibration causes piezoelectric element 3 to also deform. Piezoelectric element 3 is designed as a strip. Piezoelectric element 3 has electrically conductive metal coatings on its top and bottom which form a first electrode and a second electrode designed as a counter electrode for picking up the voltage generated by the deformation of piezoelectric element 3.

Support structure 2 has a first wing-shaped area 9a which is connected to beam-shaped area 5 via a first bar 10a assigned to support structure 2. Furthermore, support structure 2 has a second wing-shaped area 9b which is connected to beam-shaped area 5 via a second bar 10b assigned to support structure 2. Both wing-shaped areas 9a, 9b and bars 10a, 10b are designed mirror-symmetrically to one another, the mirror axis being formed by beam-shaped area 5. Bars 10a, 10b are situated at the average height of beam-shaped area 5. Restraining areas 6a, 6b at the ends of beam-shaped area 5 are also designed mirror-symmetrically.

First contacting element 7 is connected electrically conductively to support structure 2 on first wing-shaped area 9a. In this exemplary embodiment, the first contacting element has a contacting area 12a which corresponds in its contour to wing-shaped area 9a and is attached thereto via a large-surface soldered connection. For example, a connection via a conductive adhesive in particular is alternatively also possible. Support structure 2 is connected electrically conductively to the first electrode of piezoelectric element 3. In this case, the first electrode is mounted on support structure 2 with the aid of an electrically conductive adhesive. If a piezoelectric element 3 is used which does not form a first electrode itself, such an electrode may be formed in particular by support structure 2.

Second contacting element 8 has a contacting area 12b which corresponds in its contour to second wing-shaped area 9b. Contacting area 12b is attached to second wing-shaped area 9b via an electrically insulating adhesive. A contact finger 11 extends from contacting area 12b via second bar 10b and electrically contacts the second electrode of piezoelectric element 3. It is thus possible, using first and second contacting elements 7, 8, to pick up the voltages of piezoelectric element 3 generated by mechanical deformations.

As described earlier, piezoelectric element 3 does not cover the entire beam-shaped area 5 of support structure 2, but rather only its middle section. Since the bending stress increases from the restraint to the middle of the beam, the contribution of the edge areas is very small with regard to charge or energy generation. Piezoelectric material is thus saved. On the other hand, the very brittle piezoelectric material of element 3 is not located in the area of the restraint, which enables higher reliability of bending transducer 1.

Since first contacting element 7 is connected electrically conductively to the support structure outside first restraining area 6a and second restraining area 6b, the restraint of support structure 2, here via restraining areas 6a, 6b, may be established flexibly. It is particularly advantageous that first and second contacting elements 7, 8 are attached to the wing-shaped areas of solid support structure 2 which are used for mounting a seismic mass 4. Wing-shaped areas 9a, 9b are thus taking on a double function. Moreover, the symmetrical design of bending transducer 1, in particular the symmetrical design of first and second contacting elements 7, 8 and the contact of piezoelectric element 3 in the middle area of beam-shaped section 5, i.e., in the area of maximum amplitude, results in the fact that generally no relative motion occurs between first and second contacting elements 7, 8 during vibration of support structure 2 in the contacting area of the first and second electrodes of piezoelectric element 3. In this way, undesired interference of mechanical stresses by coupling contacting elements 7, 8 is largely prevented. Piezoelectric element 3 in particular is thereby exposed to lower strains. High reliability of bending transducer 1 is thus possible.

In addition to the large-surface contacting areas 12a, 12b, contacting elements 7, 8 have long, narrow spring elements 13a, 13b. The ends of these spring elements 13a, 13b are formed or bent in such a way that they lead directly to corresponding contact surfaces on a printed circuit board 23 of circuit module 20. In this way, it is possible to directly solder contacting elements 7, 8 onto printed circuit board 23; second contacting element 8 may also be soldered to the second electrode of piezoelectric element 3 via contact finger 11. In circuit module 20 shown in FIG. 2, end 14a of spring element 13a is still to be electrically connected to printed circuit board 23. Conductive adhesion of contacting elements 7, 8 or the use of spring contact pins are also possible as alternatives.

In this exemplary embodiment, support structure 2 is formed by a spring metal sheet, here a spring metal sheet made of spring steel. A bronze metal sheet is used for first and second contacting elements 7, 8. Bronze has the advantage that it is solderable and has good spring characteristics and high permanent load strength. Alternatively, first and/or second contacting element(s) 7, 8 may also be made of spring steel, for example. In particular, the support structure and first and second contacting elements 7, 8 may be made of different materials.

Support structure 2 preferably includes only such elements which have "support characteristics," i.e., they contribute to mechanical stability. In this specific embodiment, support structure 2 combines mechanical characteristics and the formation of electrode contacting. Alternatively to a one-piece design, support structure 2 may also be composed of multiple elements, e.g., it may include multiple layers. It is possible, for example, that the support structure includes a nonconductive layer which determines the mechanical characteristics and a conductive layer which causes the support structure to be electrically conductive.

Figure 2:
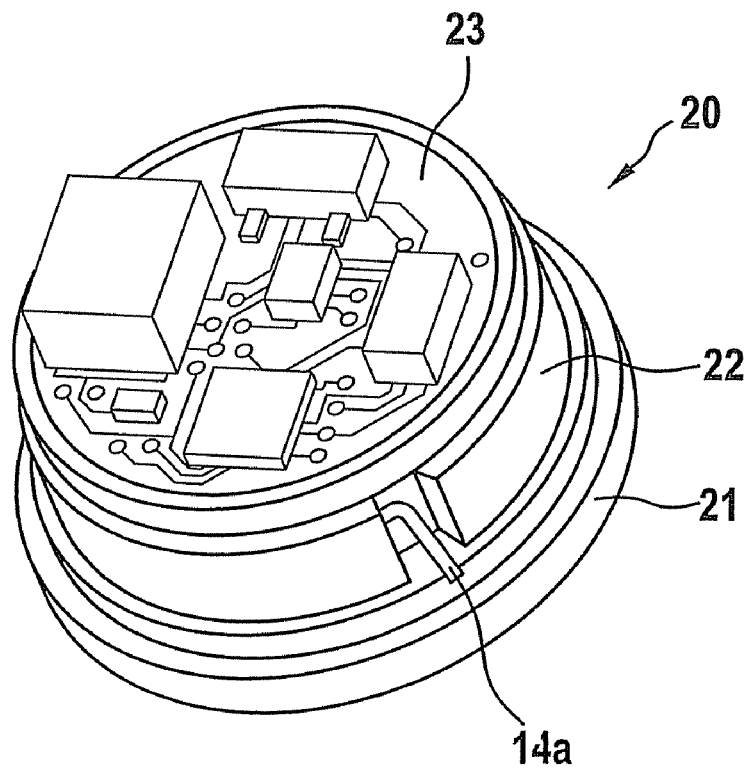
FIG. 2 shows the first circuit module.

In this exemplary embodiment, support structure 2, first contacting element 7, second contacting element 8, and piezoelectric element 3 are designed as flat, planar elements having a thin wall thickness and are arranged in such a way that bending transducer 1 has a flat, essentially planar shape. The same applies to seismic mass 4. This makes a very compact bending transducer 1 possible which requires only a small space and which is advantageous for a small circuit module 20 as shown in FIG. 2.

Figure 3:
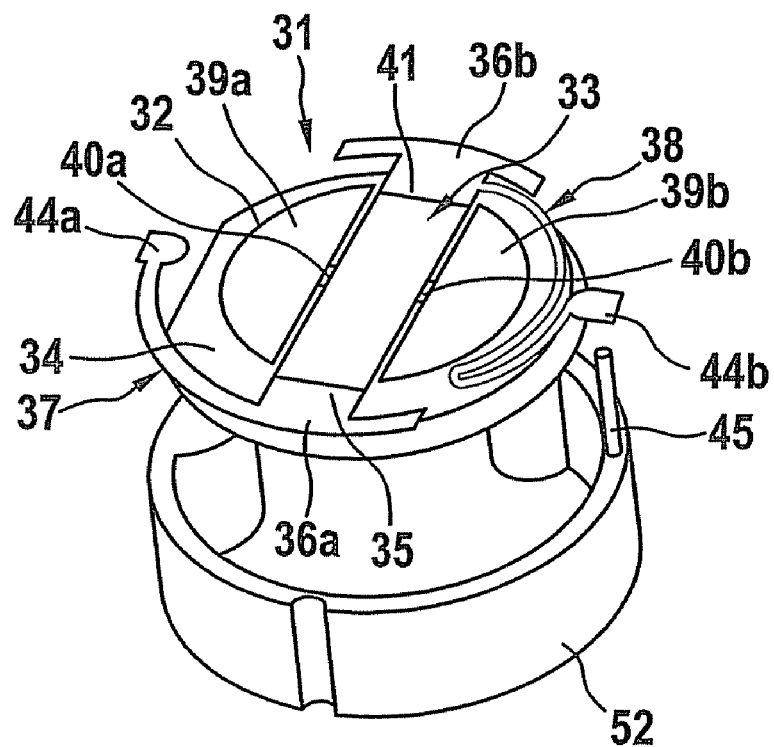
FIG. 3 shows a second specific embodiment of a bending transducer which is a component of a second circuit module.
Figure 4:
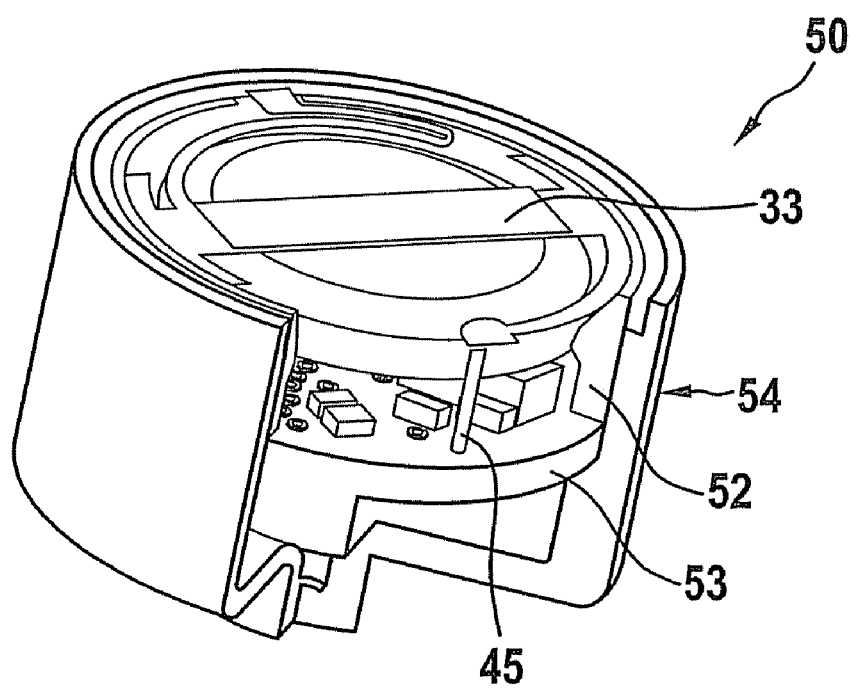
FIG. 4 shows the second circuit module.

FIG. 3 shows a second specific embodiment of a bending transducer 31 which is a component of a circuit module 50 which is shown partly in FIG. 4. Second bending transducer 31 and second circuit module 50 have a design similar to that of first bending transducer 1 and circuit module 20 so that only the differences will be discussed in the following.

Similarly to the first specific embodiment, bending transducer 31 has an elastically deformable, vibration-capable, electrically conductive support structure 32, a piezoelectric element 33, and a first contacting element 37. Conductive support structure 32 includes a first restraining area 36a and a second restraining area 36b for restraining support structure 32. Piezoelectric element 33 is designed and situated on support structure 32 in such a way that piezoelectric element 33 is deformable due to a deformation of support structure 32 because of vibration, a first electrode, for picking up the voltage generated by the deformation of piezoelectric element 33, being formed or contacted by support structure 32. However, in contrast to the first specific embodiment, first contacting element 37 is connected electrically conductively to support structure 32 in first restraining area 36a.

The vibration amplitude of vibrating support structure 32 is minimal in restraining area 36a. Coupling of mechanical stresses into support structure 32 by first contacting element 37 is therefore only slight, in particular when support structure 32 is not loosely but rather fixedly restrained.

The first contacting element is advantageously designed as a spring metal sheet, the spring metal sheet being advantageously very thin, narrow and, if needed, having a meander shape for reducing the introduction of mechanical stresses. In the second specific embodiment of bending transducer 31 it is particularly advantageous that first contacting element 37 and support structure 32 are formed in one piece since this is not expensive to manufacture and ensures high reliability. In this case, support structure 32 and first contacting element 37 are made of a one-piece spring metal sheet.

Bending transducer 31 includes a second contacting element 38 which is connected electrically conductively to the second electrode of piezoelectric element 33 for picking up the voltage generated by the deformation of piezoelectric element 33, the second contacting element being connected electrically conductively to an end section of piezoelectric element 33 with the aid of a contact finger 41 of second contacting element 38.

In this exemplary embodiment, the second contacting element is also designed as a spring metal sheet and is attached to the second electrode of piezoelectric element 33 with the aid of a soldered connection. A connection with the aid of a conductive adhesive, for example, is alternatively also possible. Electrical contacting of the second electrode of piezoelectric element 33 by second contacting element 38 in its end section offers the advantage that in this section the vibration amplitude of piezoelectric element 33 is minimal whereby introduction of mechanical stresses by second contacting element 38 is reduced.

The first contacting element has a contact surface 44a; the second contacting element has a contact surface 44b which makes it possible for a consumer to contact first and second contacting elements 37, 38. Contact surface 44a is connected to restraining area 36a of support structure 32 via a narrow bar; contact surface 44b is connected to contact finger 41 via a narrow bar bent in a meander shape. The meander-shaped, relatively long bar of second contacting element 38 reduces introduction of mechanical stresses into the system of support structure 32—piezoelectric element 33 by contact finger 41. Contact surfaces 44a, 44b are fixedly restrainable in a housing 54 of second circuit module 50. Corresponding counter contact surfaces are provided on a printed circuit board 53 situated in parallel to bending transducer 31. These counter contact surfaces are connected to contact surfaces 44a, 44b via spring contact pins 45, for example. Wire bond connections to printed circuit board 33 are alternatively also possible, for example. Bending transducer 1 and printed circuit board 53 are separated from one another by a support ring 52, support ring 52 forming a bearing with a housing bottom (not shown) of circuit module 50 for restraining bending transducer 31. As an alternative to a spring metal sheet, a spiral spring may be used for first and/or second contacting element 37, 38. In this case, the spiral spring may be attached either to the printed circuit board and the piezoelectric element or may be clamped between them via pressure contacts, similar to the spring contact pins. Due to the spring characteristic, the spiral spring may follow the deflection of support structure 32 and piezoelectric element 33 while forming a continuous electrical contact. As a further alternative, a flexible printed circuit board may also be used.

Similarly to the first specific embodiment of bending transducer 1, support structure 32 furthermore has a first and a second wing-shaped area 39a, 39b which are connected to a beam-shaped area 35 of support structure 32 via a first bar 40a and a second bar 40b. Strip-shaped piezoelectric element 33 is situated in the middle section of beam-shaped area 35. A seismic mass 34 is attached to wing-shaped areas 39a, 39b.

Figure 5:
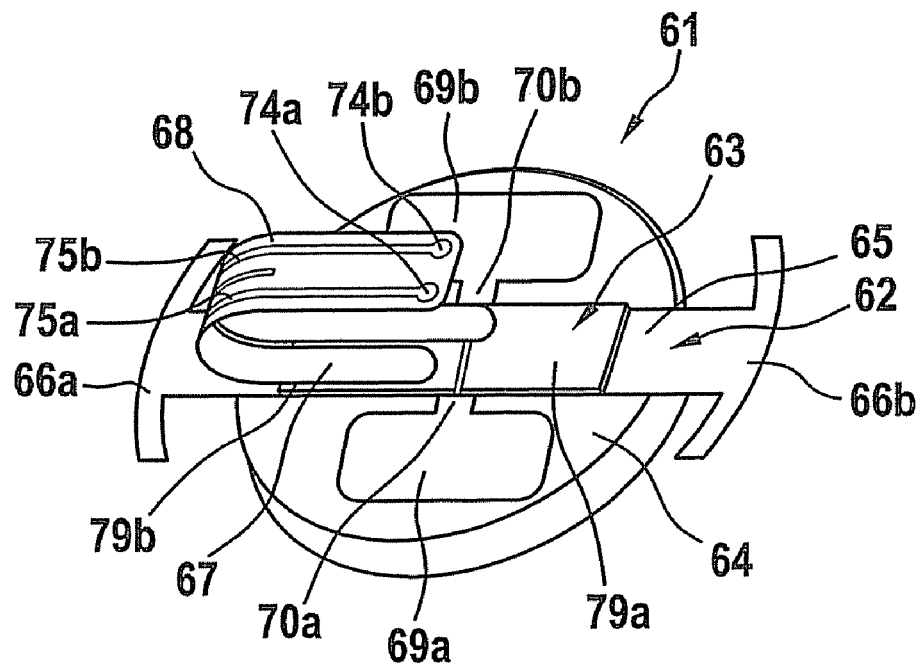
FIG. 5 shows a third specific embodiment of a bending transducer.
Figure 6:
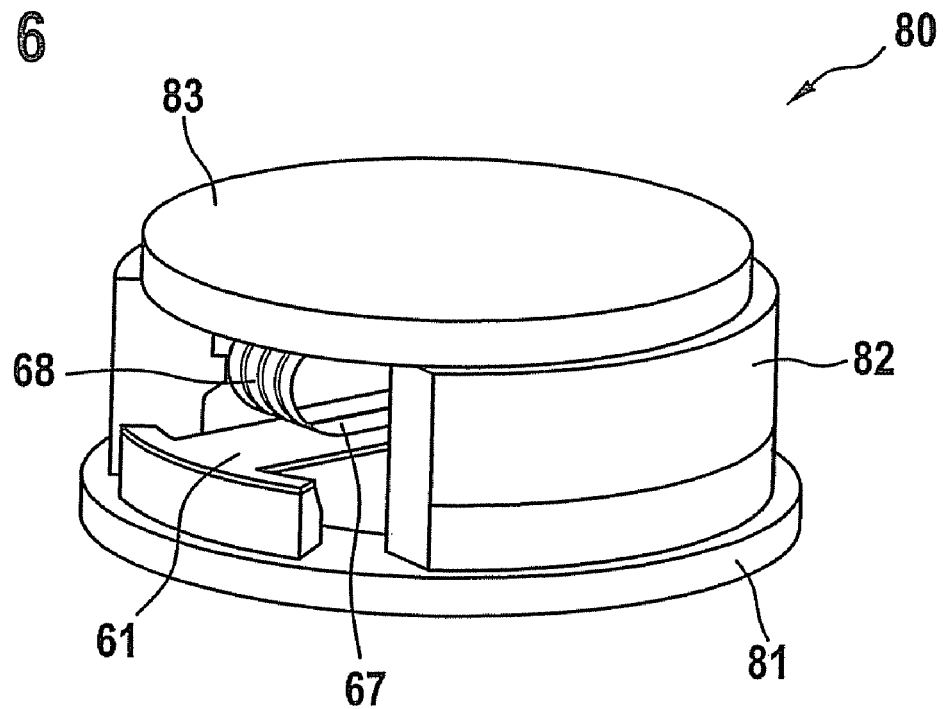
FIG. 6 shows a third circuit module which has a bending transducer according to the third specific embodiment.

FIG. 5 shows a third specific embodiment of a bending transducer 61 and a third specific embodiment of a circuit module 80 which includes third bending transducer 61 as a component of a power supply device. Bending transducer 61 and circuit module 80 are designed similarly to the preceding specific embodiments so that generally only the differences will be discussed in the following.

Bending transducer 61 for generating electrical energy from deformations includes at least one electrically deformable, vibration-capable, electrically conductive support structure 62 and one piezoelectric element 63, piezoelectric element 63 being designed and situated on support structure 62 in such a way that piezoelectric element 63 is deformable due to a deformation of support structure 62 through vibration. In contrast to the preceding specific embodiments, piezoelectric element 63 includes at least one first piezoelectric area 79a and one second piezoelectric area 79b having inverse polarizations, the support structure forming an electrical contact between a second electrode of first piezoelectric area 79a and a first electrode of second piezoelectric area 79b. Alternatively, the support structure may also form one shared electrode for first piezoelectric area 79a and second piezoelectric area 79b.

An advantage of this specific embodiment is that no contacting element which is connected electrically conductively to support structure 62 is required for picking up voltage on piezoelectric element 63 and may, in this way, introduce mechanical stresses into support structure 62 and piezoelectric element 63.

Furthermore, bending transducer 61 includes a first contacting element 67 which contacts the first electrode of piezoelectric area 79a and a second contacting element 68 which contacts the second electrode of second piezoelectric area 79b.

Alternatively, a first electrode of first piezoelectric area 79a and a second electrode of second piezoelectric area 79b may be formed by the first and/or the second contacting element(s).

First and second contacting elements 67, 68 are formed from a flexible printed circuit board material, here a flexible plastic sheet which is coated with printed conductors 75a and 75b which end in contact surfaces 74a and 74b.

One advantage of flexible printed circuit boards is that they may be freely installed in a housing, here in a housing of circuit module 80, and may thus be flexibly connected to a printed circuit board 83 (here rigid) of circuit module 80 having a sensor electrode. Another advantage of using flexible printed circuit boards is that electronic components may be placed directly on the flexible printed circuit board support.

First and second contacting elements 67, 68 are attached to piezoelectric element 63 as well as to printed circuit board 83 with the aid of soldered connections. Alternatively, adhesive bonds are also possible, for example. It is alternatively also possible to use a wire, a spring metal sheet, or a helical spring for first and/or second contacting element 67, 68.

Similarly to the preceding specific embodiments, support structure 62 has a beam-shaped area 65 having two sickle-shaped end sections 66a, 66b, as well as a first wing-shaped area 69a and a second wing-shaped area 69b which are connected to beam-shaped area 65 at the average height of beam-shaped area 65 via a first bar 70a and a second bar 70b. A seismic mass 64 is attached to wing-shaped areas 69a, 69b with the aid of an adhesive bond.

In addition to printed circuit board 83, on which the electronic system is assembled, circuit module 80 has a housing bottom 81 and a support ring 82. Bending transducer 61 is situated on housing bottom 81; printed circuit board 83 is situated above bending transducer 61 and is supported by support ring 82. Support ring 82 is formed in one piece with the housing bottom. A housing cover (not shown) assigned to circuit module 80 forms a bearing for restraining areas 66a, 66b of support structure 62 similarly to the first specific embodiment of the circuit module; support structure 62 may be restrained loosely or, alternatively, also fixedly.

For all specific example embodiments presented here, seismic mass 4, 34, 64 may be attached to the top, the bottom, and/or to both sides of wing-shaped areas 9a, 9b, 39a, 39b, 69a, 69b of support structures 2, 32, 62 when contacting elements 7, 8, 37, 38, 67, 68 are appropriately designed. The shape of seismic mass 4, 34, 64 is largely freely adaptable to the housing shape of circuit module 20, 50, 80 and may have a rectangular-shaped or cylinder-shaped design.

What is claimed is:

1. A bending transducer for generating electrical energy from deformations, comprising:
   at least one elastically deformable, vibration-capable, electrically conductive support structure, the conductive support structure having a first restraining area and a second restraining area for restraining the support structure;
   a piezoelectric element designed and situated on the support structure in such a way that the piezoelectric element is deformable due to a deformation of the support structure;
   a first contacting element to contact the piezoelectric element, the first contacting element being connected electrically conductively to the support structure outside the first restraining area and the second restraining area; and
   a first electrode for picking up a voltage generated by a deformation of the piezoelectric element, the first electrode being formed or contacted by the support structure.

2. The bending transducer as recited in claim 1, wherein the support structure has a beam-shaped area having a first end section and a second end section opposite the first end section, the first end section forming the first restraining area and the second end section forming the second restraining area, and the piezoelectric element being situated on the beam-shaped area between the first and the second end section.

3. The bending transducer as recited in claim 2, wherein the support structure has a first wing-shaped area which is connected to the beam-shaped area via a first bar assigned to the support structure and the first contacting element is connected electrically conductively to the support structure on the first wing-shaped area.

4. The bending transducer as recited in claim 1, wherein the piezoelectric element is designed in a shape of a strip and the piezoelectric element, on its top and bottom, has an electrically conductive coating, which forms a first and a second electrode for picking up the voltage generated by the deformation of the piezoelectric element.

5. The bending transducer as recited in claim 4, wherein the coating is a metal coating.

6. The bending transducer as recited in claim 3, further comprising:
a second contacting element which connected electrically conductively to a second electrode for picking up the voltage generated by the deformation of the piezoelectric element, the second contacting element, with respect to the first contacting element, being designed and situated in such a way that between the first and second contacting elements there is no relative motion in a contacting area of the first and second electrodes during vibration of the support structure.

7. The bending transducer as recited in claim 6, wherein the support structure has a second wing-shaped area which is connected to the beam-shaped area via a second bar assigned to the support structure and the second contacting element is connected electrically non-conductively to the second wing-shaped area.

8. The bending transducer as recited in claim 5, wherein the second contacting element has a contact finger, the second electrode being electrically contacted with the aid of the contact finger.

9. The bending transducer as recited in claim 8, wherein the first bar, the second bar, and the contact finger are situated at a same height of the beam-shaped area.

10. The bending transducer as recited in claim 9, wherein at least one of: i) the first and second contacting elements, ii) the first and second bar, iii) the first and second wing-shaped areas, and iv) the first and second end sections, are symmetrically designed and situated toward each other.

11. The bending transducer as recited in claim 1, wherein the first contacting element is an electrically conductive metal sheet.

12. The bending transducer as recited in claim 11, wherein the first contacting element is a bronze metal sheet.

13. The bending transducer as recited in claim 7, wherein a seismic mass is attached to at least one of the first wing-shaped area and the second wing-shaped area.

14. The bending transducer as recited in claim 1, wherein at least one of the support structure, the first contacting element, and the piezoelectric element are flat and planar elements and are situated in such a way that the bending transducer has a flat planar shape.

15. A circuit module, comprising:
a power supply device, including a bending transducer;
at least one elastically deformable, vibration-capable, electrically conductive support structure, the conductive support structure having a first restraining area and a second restraining area for restraining the support structure;
a piezoelectric element designed and situated on the support structure in such a way that the piezoelectric element is deformable due to a deformation of the support structure;
a first contacting element to contact the piezoelectric element, the first contacting element being connected electrically conductively to the support structure outside the first restraining area and the second restraining area; and
a first electrode for picking up a voltage generated by a deformation of the piezoelectric element being formed or contacted by the support structure;
wherein the bending transducer forms a vibration-capable system for generating piezoelectric voltage, designed as an energetically self-sufficient tire sensor module for measuring at least one of an internal tire pressure, a temperature, and an acceleration.

* * * * *